US009769597B2

(12) United States Patent
Jin et al.

(10) Patent No.: US 9,769,597 B2
(45) Date of Patent: Sep. 19, 2017

(54) DUAL-MODE RADIO FREQUENCY TRANSCEIVER ARCHITECTURE

(71) Applicant: Telink Semiconductor (Shanghai) Co., LTD., Shanghai (CN)

(72) Inventors: Haipeng Jin, Shanghai (CN); Wenjun Sheng, Shanghai (CN); Mingjian Zheng, Shanghai (CN)

(73) Assignee: TELINK SEMICONDUCTOR (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 15/089,892

(22) Filed: Apr. 4, 2016

(65) Prior Publication Data

US 2017/0188182 A1    Jun. 29, 2017

(30) Foreign Application Priority Data

Dec. 25, 2015 (CN) .......................... 2015 1 0996809

(51) Int. Cl.
| | |
|---|---|
| H04M 1/00 | (2006.01) |
| H04W 4/00 | (2009.01) |
| H04L 27/227 | (2006.01) |
| H04L 27/12 | (2006.01) |
| H04L 27/20 | (2006.01) |
| H04B 1/00 | (2006.01) |
| H04L 25/02 | (2006.01) |
| H04W 88/06 | (2009.01) |
| H04B 1/04 | (2006.01) |

(52) U.S. Cl.
CPC .......... *H04W 4/008* (2013.01); *H04B 1/0014* (2013.01); *H04L 25/02* (2013.01); *H04L 27/12* (2013.01); *H04L 27/20* (2013.01); *H04L 27/2272* (2013.01); *H04B 2001/0408* (2013.01); *H04W 88/06* (2013.01)

(58) Field of Classification Search
CPC ..................................................... H04W 4/008
USPC ......................................................... 455/552.1
See application file for complete search history.

(56) References Cited

U.S. PATENT DOCUMENTS

| | | | | |
|---|---|---|---|---|
| 6,469,649 | B1* | 10/2002 | Helkey | ..................... G02F 7/00 |
| | | | | 341/143 |
| 2011/0051844 | A1* | 3/2011 | Rofougaran | ......... H04B 1/0475 |
| | | | | 375/298 |
| 2015/0155891 | A1* | 6/2015 | Soliman | ............... H04B 1/0067 |
| | | | | 455/552.1 |

* cited by examiner

*Primary Examiner* — Sanh Phu
(74) *Attorney, Agent, or Firm* — Nixon & Vanderhye P.C.

(57) ABSTRACT

The present disclosure relates to a ZigBee/Bluetooth dual-mode radio frequency transceiver architecture, in which, a dual-mode baseband and firmware determines hardware parameter of a receiving module or sending module based on a first mode or a second mode; a radio frequency front-end module is used for receiving or sending a first mode signal or a second mode signal; a receiving module is used for converting the first mode signal received by the radio frequency front-end module into a first mode baseband digital signal, or converting the second mode signal received by the radio frequency front-end module into a second mode baseband digital signal and outputting the first mode baseband digital signal or the second mode baseband digital signal to the dual-mode baseband and firmware; a sending module is used for converting the first mode baseband digital signal outputted by dual-mode baseband and firmware into the first mode signal.

7 Claims, 3 Drawing Sheets

DUAL-MODE RADIO FREQUENCY TRANSCEIVER ARCHITECTURE

TECHNICAL FIELD

The present disclosure generally relates to the electronics and communication field, and particularly relates to a dual-mode radio frequency (RF) transceiver architecture.

BACKGROUND

Smart Home, with residence as its platform, utilizes generic cabling technology, network communications technology, security technology, automatic control technology and audio-video technology to integrate home life-related facilities, construct high-efficiency residential facilities and management system for family matters, improve home safety, convenience, comfortableness and artistry, and achieve an environmental friendly and energy-saving living environment.

The current names for Smart Home are in the dozens, for example, Electronic Home (e-Home), Digital family, Home Automation, Home net/Networks for Home, Network Home, Intelligent home, etc. Although the names are different, their meanings and desired functions are basically the same.

Smart Home is defined as a system utilizing computer, network and generic cabling technologies, integrating various home life-related subsystems through family information management platform. First of all, a communication network is built in the home, to provide necessary channels for family information and achieve control and monitoring on all home appliances and facilities on the family network through corresponding hardware and executive agencies under the control of family network operating system. Secondly, they all form communication channels with the outside through certain media in order to communicate information with the outside world, satisfying the need for remote control/monitoring and information exchange. Lastly, their final goal is to satisfy people's need for safety, comfortableness, convenience and environmental protection.

As communication technology evolves, when wired Smart Home is forced out of the market due to intricate cabling, difficulty to promote and excessive cost, wireless transmission technology becomes the best choice for new generation Smart Home due to no need for cabling and easy installation. However, Smart Home products on the current market, due to merits of different transmission technology, lead to a situation that multiple communication technologies (e.g. Bluetooth, WiFi, and ZigBee) coexist, and, employing different wireless standards result in low interoperability between Smart Home products from different manufacturers, severely limiting the promotion and application of Smart Home.

SUMMARY

Objects of the present disclosure are to provide a dual-mode radio frequency transceiver architecture, which allow a dual-mode device to communicate with ZigBee and Bluetooth devices at the same time, so as to not only improve the flexibility of wireless communication networking, but also further reduce equipment cost.

In order to solve the technical problems above, there is provided a dual-mode radio frequency transceiver architecture in the embodiments of the present invention, comprising: a radio frequency front-end module, a receiving module, a sending module, as well as a dual-mode baseband and firmware; the dual-mode baseband and firmware determine hardware parameters of the receiving module or sending module based on a first mode or a second mode; the radio frequency front-end module is used for receiving or sending a first mode signal or a second mode signal; the receiving module is used for converting the first mode signal received by the radio frequency front-end module into a first mode baseband digital signal, or converting the second mode signal received by the radio frequency front-end module into a second mode baseband digital signal, and output the first mode baseband digital signal or the second mode baseband digital signal to the dual-mode baseband and firmware; the sending module is used for converting the first mode baseband digital signal outputted by the dual-mode baseband and firmware into the first mode signal, or converting the second mode baseband digital signal outputted by the dual-mode baseband and firmware into the second mode signal, and output the first mode signal or the second mode signal to the radio frequency front-end module; wherein, the first mode is Bluetooth Low Energy BLE, the second mode is ZigBee.

Compared to the prior art, the embodiments of the present disclosure provide a dual-mode radio frequency transceiver architecture comprising: a radio frequency front-end module, a receiving module, a sending module, a dual-mode baseband and firmware; the dual-mode baseband and firmware can determine hardware parameters of the receiving module and the sending module based on a first mode (Bluetooth mode) or a second mode (ZigBee mode), allowing the receiving module to convert a Bluetooth signal received by the radio frequency front-end module into the first mode baseband digital signal, or convert a ZigBee signal received by the radio frequency front-end module into the second mode baseband digital signal, and output the first mode baseband digital signal or the second mode baseband digital signal to the dual-mode baseband and firmware; whereas the sending module can convert the first mode baseband digital signal outputted by the dual-mode baseband and firmware into the Bluetooth signal or convert the second mode baseband digital signal into the ZigBee signal, and send the Bluetooth signal or the ZigBee signal through the radio frequency front-end module. Based on such dynamic configuration, the embodiments of the present invention can achieve dual-mode transmission using one set of radio frequency transceivers, thus solving the problem: Bluetooth and ZigBee cannot be used at same time since they are used as two different transceivers which greatly differ in receiving and sending architecture. Moreover, because the dual-mode baseband and firmware can uniformly configure hardware parameters of the sending module and receiving module based on Bluetooth protocol or ZigBee protocol, maximizing sharing of hardware, the dual-mode transceiver's cost is close to that of a single-mode transceiver, thus greatly reducing equipment cost.

In one exemplary embodiment, the receiving module comprises: a low noise amplifier, a mixer, a receiving-end phase locked loop, a complex filter, a limiter and an analog-to-digital converter; the low noise amplifier is used for amplifying the first mode signal or second mode signal received by the radio frequency front-end module; the slide mixer removes the carrier frequency of the amplified first mode signal or second mode signal based on the local oscillator frequency outputted by the receiving-end phase locked loop; the complex filter filters the carrier frequency-removed first mode signal or second mode signal based on the first mode or second mode and outputs the filtered first mode signal or second mode signal to the limiter; wherein, the complex filter is a programmable filter; the limiter is used for conducting amplitude limiting on the filtered first mode signal or second mode signal; the analog-to-digital converter converts the amplitude-limited first mode signal into the first mode baseband digital signal, or convert the second mode signal into the second mode baseband digital signal, and output the first mode baseband digital signal or the second mode baseband digital signal to the dual-mode baseband and firmware. Thus one set of receiving modules can process the Bluetooth and ZigBee signal at the same time, which not only greatly reduces hardware cost, but also is good for smaller product size, simpler network configuration and more flexible networking.

In one exemplary embodiment, the sending module comprises: a digital-to-analog converter, a shaping filter, a sending-end phase locked loop and a power amplifier; the digital-to-analog converter conducts digital-to-analog conversion on the first mode baseband digital signal or second mode baseband digital signal outputted by the dual-mode baseband and firmware based on the first mode or second mode; the dual-mode baseband and firmware turns on the low-pass filter based on the first mode, the low-pass filter is used for shape filtering the converted first mode baseband digital signal and send the shape-filtered first mode baseband digital signal out, the sending-end phase locked loop is used for outputting carrier frequency corresponding the first mode; the power amplifier amplifies the first mode baseband digital signal bearing the carrier frequency and outputs the amplified first mode baseband digital signal to the radio frequency front-end module; the dual-mode baseband and firmware turns off the low-pass filter based on the second mode, the sending-end phase locked loop is used for outputting carrier frequency corresponding the second mode, the power amplifier amplifies signal bearing the carrier frequency output by the sending-end phase locked loop and outputs the amplified signal bearing the carrier frequency to the radio frequency front-end module. Thus one set of sending modules can process both Bluetooth and ZigBee signal, thereby not only greatly reducing hardware cost, but also being good for smaller product size, simpler network configuration and more flexible networking.

In one exemplary embodiment, the dual-mode baseband and firmware further comprises: a dual-mode protocol stack scheduling module, a first mode protocol stack and a second mode protocol stack; the dual-mode protocol stack scheduling module is used for uniformly scheduling transmission event of the first mode protocol stack and second mode protocol stack; the dual-mode protocol stack scheduling module calls unified hardware calling interface according to preset interval to set up a Bluetooth transmission channel, and at each Bluetooth connection interval, sets up a ZigBee transmission channel, thereby taking advantage of features of Bluetooth and ZigBee transmission requirement, which ensures the robustness of Bluetooth connection, and also timely completes ZigBee data transmission.

In one exemplary embodiment, the dual-mode baseband and firmware comprises: a digital signal conversion module and a modulation module; the dual-mode baseband and firmware calls the digital signal conversion module to convert an offset-Quadrature Phase Shift Keying O-QPSK signal into a second mode equivalence bit stream based on the second mode; the modulation module is used for modulating the second mode equivalence bit stream or first mode bit stream in a way of Frequency shift keying FSK to obtain the second mode baseband digital signal or the first mode baseband digital signal. The present embodiment can, through simple signal conversion, allow an O-QPSK radio frequency emission signal to be obtained directly using a FSK FM modulator, thereby enabling the ZigBee signal and Bluetooth signal to share one set of frequency modulators, thus greatly reducing complexity of hardware and lowering power consumption of chips. Moreover, by utilizing signal equivalence, when processing emission and reception, the hardware sharing of Bluetooth and ZigBee processing is maximized, thus using one set of single-mode transceiver-equivalent modules to achieve the work of dual-mode module.

The above simplified summary of example embodiments serves to provide a basic understanding of the present invention. This summary is not an extensive overview of all contemplated embodiments, and is intended to neither identify key or critical elements of all embodiments nor delineate the scope of any or all embodiments of the present invention. Its sole purpose is to present one or more embodiments in a simplified form as a prelude to the more detailed description of the disclosure that follows. To the accomplishment of the foregoing, the one or more embodiments of the present invention include the features described and particularly pointed out in the claims.

BRIEF DESCRIPTION OF THE DRAWINGS

The accompanying drawings, which are incorporated into and constitute a part of this specification, illustrate one or more example aspects of the present disclosure and, together with the detailed description, serve to explain their principles and implementations.

DETAILED DESCRIPTION

In order to make the goal, technical solution and advantage of the present disclosure more clear, in the following description, details of various embodiments of the present disclosure will be given accompanying the drawings. However, it will be apparent to those of ordinary skill in the art that specific technical details are given in various embodiments of the present disclosure for the purpose of better understanding of the present application. However, even without these technical details and various changes and modifications based on the following embodiments, the claimed technical solution may still be accomplished.

Figure 1:
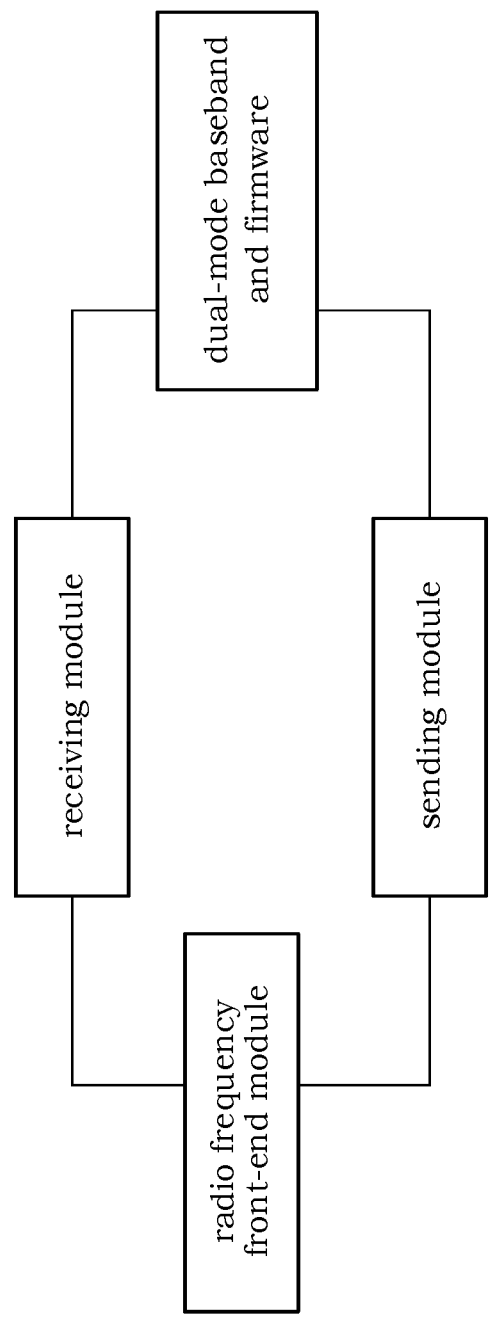
FIG. 1 is a block diagram of a dual-mode radio frequency transceiver architecture according to an embodiment of the present disclosure.
Figure 2:
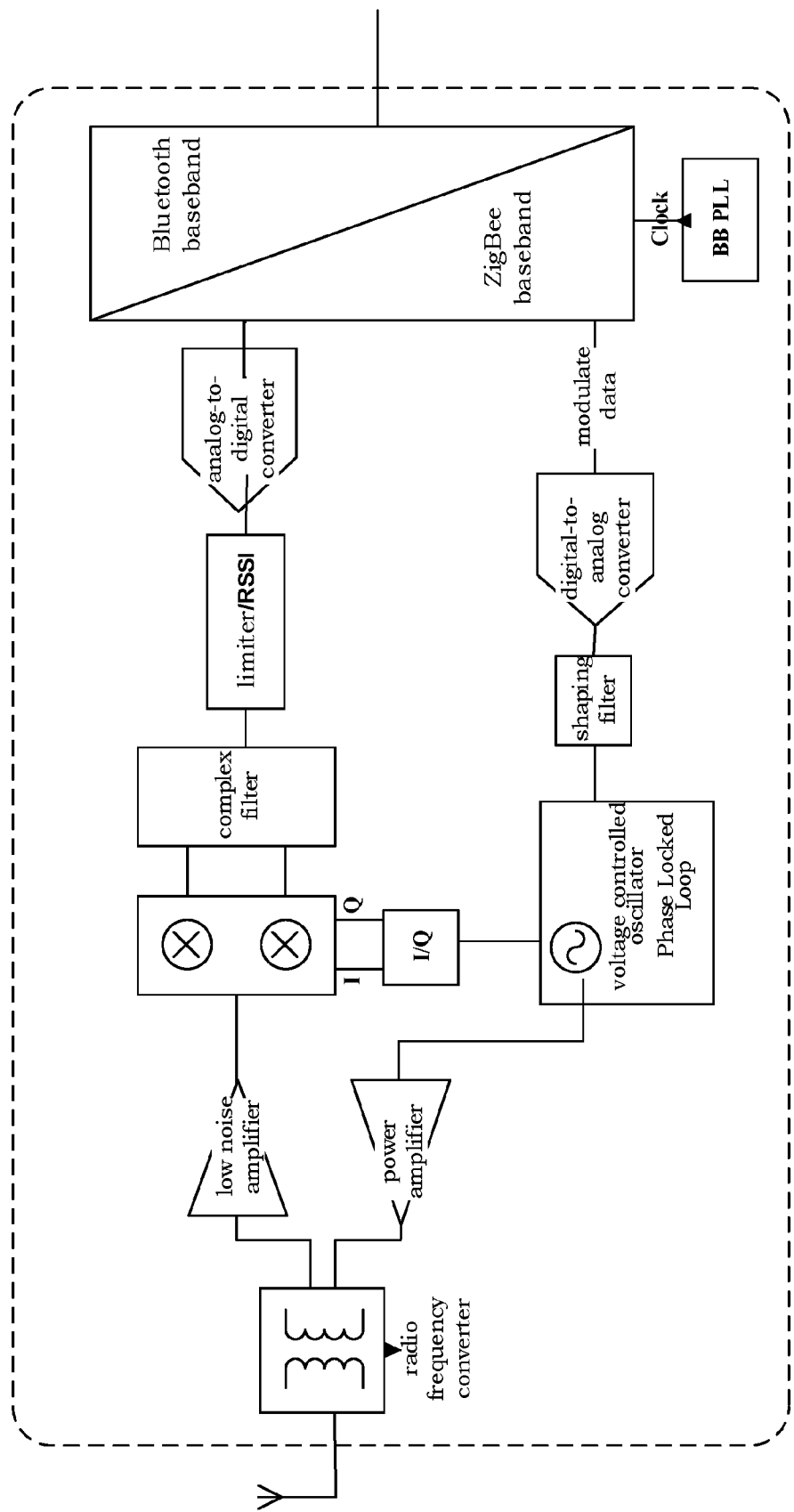
FIG. 2 is a schematic diagram of a dual-mode radio frequency transceiver architecture according to an embodiment of the present disclosure.
Figure 3:
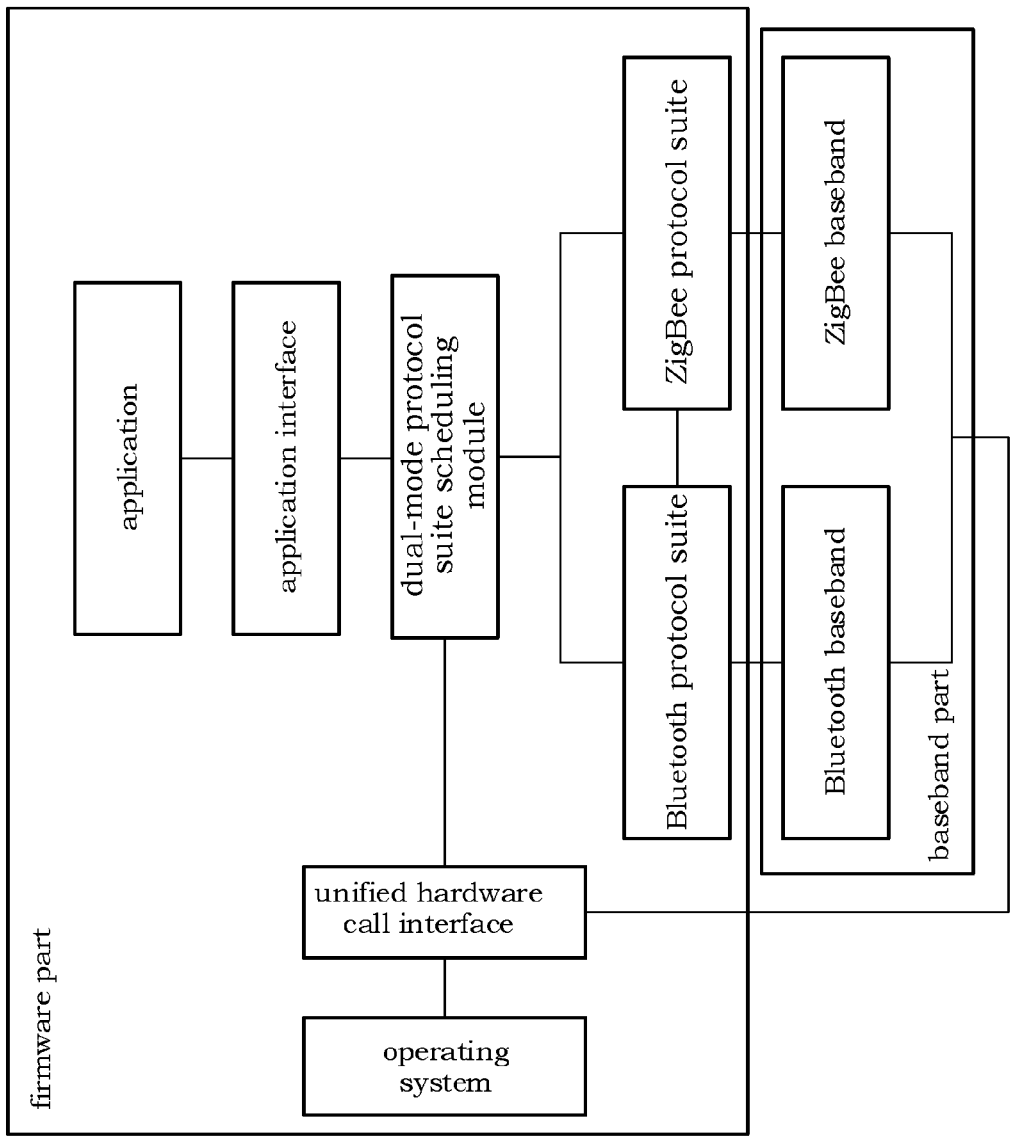
FIG. 3 is a block diagram of a dual-mode baseband and firmware according to an embodiment of the present disclosure.

The first embodiment of the present disclosure relates to a dual-mode radio frequency transceiver architecture, and "dual-mode" refers to Bluetooth mode (first mode) and ZigBee mode (second mode). As shown in FIGS. 1, 2 and 3, the dual-mode radio frequency transceiver architecture comprises: a radio frequency front-end module, a receiving module, a sending module, a dual-mode baseband and firmware.

The dual-mode baseband and firmware comprises a baseband part and a firmware part, whereas the baseband part comprises a Bluetooth baseband and a ZigBee baseband, the firmware part comprises a unified hardware calling interface, a Bluetooth protocol stack (i.e. first mode protocol stack), a ZigBee protocol stack (i.e. second mode protocol stack), a dual-mode protocol stack scheduling module, an operating system and an application program interface.

The Bluetooth baseband comprises a Bluetooth encoding module, a Bluetooth calibration module, and a Bluetooth packet module; the ZigBee baseband comprises a ZigBee encoding module, a ZigBee calibration module, and a ZigBee packet module. Because the formats of Bluetooth data packet and ZigBee data packet are different, the Bluetooth baseband and ZigBee baseband each keeps a set of encoding module, calibration module, and packet module respectively. Because the Bluetooth baseband and ZigBee baseband can share modules for synchronization, frequency offset and clock tracking, only one set of such modules is required in the present embodiment to achieve synchronization, frequency offset and clock tracking.

Generally speaking, the chips in Bluetooth and ZigBee devices have their own modulation and demodulation module respectively. Bluetooth's modulation and demodulation module uses a FSK (Frequency Shift Keying) mode to modulate the Bluetooth signal to obtain the first mode baseband digital signal, and ZigBee's modulation and demodulation module uses a DSSS O-QPSK (Quadrature Phase Shift Keying) mode to modulate the ZigBee signal to obtain the second mode baseband digital signal. In the present embodiment, the dual-mode and firmware further comprises a digital signal conversion module. When the dual-mode devices works in the ZigBee mode, the dual-mode baseband and firmware calls the digital signal conversion module to convert ZigBee's O-QPSK signal into the second mode equivalence bit stream according to the requirement of ZigBee communication, and the modulation module is used for directly modulating the second mode equivalence bit stream with an FSK modulator to obtain the second mode baseband digital signal, and this modulation module is also used for modulating the Bluetooth signal to obtain the first mode baseband digital signal. For technology of converting the offset-Quadrature Phase Shift Keying O-QPSK signal into the second mode equivalence bit stream, see the applicant's published application, Publication Number: 103001921A, here the details are omitted. By processing ZigBee signal O-QPSK, the complexity of chips is reduced, achieving multiplexing with Bluetooth, reducing chip size and power consumption.

Accordingly, the dual-mode baseband and firmware further comprises: a digital signal reverse-conversion module and a demodulation module. The demodulation module is used for demodulating the first mode baseband digital signal or second mode baseband digital signal. The demodulated second mode baseband digital signal is then converted by the digital signal reverse-conversion module into the equivalent offset-Quadrature Phase Shift Keying O-QPSK signal which is sent to a decoding module for being decoded.

Both the Bluetooth and ZigBee communication modes use 2.4 Ghz frequency band, through the equivalence processing above, most modules of transceiver can be multiplexed. However, Bluetooth's data transmission rate is 1 Mbps or 2 Mbps and requires shape-filtering; ZigBee's data transmission rate is 256 Kbps, and have different anti-interference requirement from Bluetooth's. Therefore, between the Bluetooth and ZigBee's sending and receiving modules, some hardware's configuration parameters are different. The present embodiment applies one set of receiving modules and sending modules for processing the radio frequency front-end module and dual-mode signal, and adds an unified hardware calling interface to the baseband and firmware, thus calling the unified hardware calling interface according to signal rates and inference suppression requirements of the Bluetooth mode and ZigBee mode so as to determine hardware parameters of the sending module and receiving module, the following will further explain the present disclosure and specify the composition of the receiving module and sending module.

The radio frequency front-end module is used for receiving or sending the first mode signal or a second mode signal. Because Bluetooth and ZigBee use same operating frequency band, The radio frequency front-end module of the embodiments can share antenna, thus reducing hardware cost.

The sending module comprises: a digital-to-analog converter, a shaping filter, a sending-end phase locked loop (PLL), a voltage controlled oscillator and a power amplifier. The digital-to-analog converter is used for conducting digital-to-analog conversion on the first mode baseband digital signal or second mode baseband digital signal outputted by the dual-mode baseband and firmware. In one exemplary embodiment, the digital-to-analog converter is configured by the unified hardware calling interface of the dual-mode baseband and firmware. When the dual-mode device is working in the Bluetooth mode, the digital-to-analog converter works in a multi-bit mode; when the dual-mode device is working in the ZigBee mode, the digital-to-analog converter work in a single bit mode, thus it is achieved to process Bluetooth and ZigBee signals at the same time using one set of digital-to-analog converters.

When the dual-mode device works in the Bluetooth mode, the dual-mode baseband and firmware can turn on the shaping filter based on the first mode, and the filter is used for shape-filtering the Bluetooth signal and send the shape-filtered Bluetooth signal, in the meantime, the sending-end phase locked loop and the voltage controlled oscillator output corresponding local oscillator frequency according to the Bluetooth mode, the shape-filtered Bluetooth signal is sent to the power amplifier bearing carrier frequency, the power amplifier amplifies the Bluetooth signal and sends the amplified Bluetooth signal to the radio frequency front-end module. Whereas when the dual-mode device is working in the ZigBee mode, the dual-mode baseband and firmware can turn off the shaping filter based on the second mode, the sending-end phase locked loop is used for outputting carrier frequency corresponding to the second mode, and the ZigBee signal is processed by the digital-to-analog converter, and then load second mode carrier frequency through the sending-end phase locked loop and voltage controlled filter, amplified by the power amplifier and sent to the radio frequency front-end module for emission. Both the sending-end Phase Locked Loop and shaping filter can apply programmable device, through hardware configuration, to achieve the processing of Bluetooth and ZigBee signal at the same time, reducing hardware cost.

The receiving module comprises: a low noise amplifier, a mixer, a receiving-end phase locked loop, a complex filter, a limiter, a signal intensity indication module and an analog-to-digital converter. Wherein, all of the mixer, the receiving-end phase locked loop, the complex filter etc. can apply programmable module, which is uniformly configured by the unified hardware calling interface.

The low noise amplifier amplifies the received Bluetooth signal or ZigBee signal and output amplified signal to the slide mixer. The mixer removes the carrier of the Bluetooth signal or ZigBee signal based on the local oscillator frequency outputted by the Receiving-end PLL. Wherein, the mixer's local oscillator carrier frequency can be determined according to transmission frequency of Bluetooth or ZigBee.

The complex filter filters the carrier-removed Bluetooth signal or ZigBee signal. Because the Bluetooth and ZigBee signal differs in bandwidth and anti-interference requirements, the complex filter's bandwidth and response can be dynamically adjusted by adjusting hardware configuration parameters, so as to best match Bluetooth or ZigBee signal.

Filtered by the complex filter, the signal is outputted to the limiter, which conducts amplitude limiting on the Bluetooth signal or ZigBee signal and outputs a signal with appropriate output amplitude to the analog-to-digital converter, the analog-to-digital converter converts the Bluetooth signal or ZigBee signal into the first mode baseband digital signal or the second mode baseband digital signal and outputs the first mode baseband digital signal or the second mode baseband digital signal to the dual-mode baseband and firmware. The Bluetooth baseband of the dual-mode baseband and firmware conducts demodulation, de-CRC (decoding CRC) and decoding on the received Bluetooth baseband digital signal (i.e. the first mode baseband digital signal) and outputs the processed Bluetooth baseband digital signal; the ZigBee baseband of the dual-mode baseband and firmware conducts demodulation, de-CRC (decoding CRC) and decoding on the received ZigBee baseband digital signal (i.e. the second mode baseband digital signal) and outputs the processed ZigBee baseband digital signal. Because the Bluetooth signal and ZigBee signal can be equivalent as FSK signals, the two kinds of baseband can share the modules for synchronization, frequency offset and clock tracking, only one set of such modules is required in the present embodiment to achieve synchronization, frequency offset and clock tracking.

Through the measures mentioned above, the dual-mode radio frequency transceiver architecture of the present embodiment maximizes the sharing between the Bluetooth device and ZigBee device, thereby greatly reducing the hardware scale of the dual-mode device, and achieving Bluetooth and ZigBee data communication at the same time.

When the dual-mode device communicates with the Bluetooth device and ZigBee device at the same time, a Bluetooth slave monitors a Bluetooth host at each connection interval due to the strict maintenance mechanism of Bluetooth connection, whereas ZigBee connection requirement is relatively loose. Therefore, the dual-mode protocol stack scheduling module is applied to uniformly scheduling transmission event of the first mode protocol stack and second mode protocol stack. The dual-mode protocol stack scheduling module can call the unified hardware calling interface at preset interval to set up the Bluetooth transmission channel, and at each interval between Bluetooth connection, set up the ZigBee transmission channel. Moreover, the dual-mode protocol stack scheduling module can determine whether to configure the sending module and receiving module to the ZigBee communication mode by judging the transmission duration of ZigBee data, thereby setting up the Bluetooth or ZigBee transmission channel. In particular, the dual-mode device, as a slave device, matches Bluetooth host device. Moreover, after the dual-mode device, as a control device, matches a ZigBee target device, the dual-mode device conducts Bluetooth connection maintenance according to preset interval, and at each Bluetooth connection interval, processes information exchange with the target ZigBee device. Wherein, the dual-mode device, during the Bluetooth low power consumption maintenance period, periodically exchanges data with the Bluetooth host device; whereas the time for receiving and sending ZigBee data is scheduled flexibly. The Bluetooth connection interval means the idle gap between each two adjacent Bluetooth communication gap during the Bluetooth low power consumption maintenance. The present embodiment can artfully utilize the idle gap to execute ZigBee transmission event, thus achieving simultaneous communication of the Bluetooth and ZigBee device in the dual-mode device. Moreover, because the ZigBee transmission event is executed at the connection intervals of Bluetooth connection, Bluetooth operation won't be affected. Therefore, the embodiment of the present disclosure can effectively improve network communication efficiency.

In addition, in specific implementation, the dual-mode baseband and firmware of the present embodiment can fully utilize existing modules of ZigBee/Bluetooth protocol stack, and be embedded with a simple operating system, an application program interface and install applications for smart home, smart lighting, wearable smart device, etc. The dual-mode baseband and firmware also support application development based on ZigBee and Bluetooth framework as well as Bluetooth customized service, thereby making application extension more flexible. The dual-mode baseband and firmware also can have built-in OTA (over-the-air technology) mechanism, making firmware upgrade more convenient.

An example of the application of the dual-mode device based on the dual-mode radio frequency transceiver architecture of the present embodiment in smart home is now given so as to illustrate the advantage of the present embodiment. A smart home application usually includes both Bluetooth device and ZigBee device. The Bluetooth devices include, for example, Personal Digital Assistant (PDA), portable computer, cellphone, etc. These Bluetooth devices can conveniently access cloud service or backbone network, achieving remote control. Both the current mainstream mobile communication systems—iOS and Android support Bluetooth communication well. Since 2014, all the new smartphones are equipped with Bluetooth 4.0, making it easy for smartphones and mobile computers to control household Bluetooth devices. The ZigBee devices include, for example, smart home appliances (e.g. refrigerator, air-conditioning), various sensors (e.g. temperature sensor, humidity sensor), smart curtain, wireless earphone, etc. ZigBee can support multi-hop, flexible router in large scale mesh network architecture and can self-repair. In real application scenario, ZigBee can support up to hundreds of ZigBee nodes. Moreover, in smart home appliances field, ZigBee protocol has already defined the behavior characteristic of switch, electronics, lighting and various sensors, meeting market application demand. The Dual-mode devices simultaneously achieve communication with the ZigBee nodes and Bluetooth devices by applying the present embodiment of dual-mode radio frequency transceiver architecture, thereby improving networking flexibility.

Therefore, compared to prior art, the dual-mode radio frequency transceiver architecture of the present embodiment, through one set of integrated transceivers, can achieve both ZigBee data exchange and Bluetooth data exchange, thus shrinking the hardware scale, reducing cost; moreover, the dual-mode radio frequency transceiver architecture schedules transmission time sequence for Bluetooth and ZigBee, and thus achieves ZigBee data exchange without Bluetooth being offline, thereby effectively securing the reliability and high-efficiency of communication.

In various embodiments, the systems and methods described herein may be implemented in hardware, software, firmware, or any combination thereof. If implemented in software, the methods may be stored as one or more instructions or code on a non-transitory computer-readable medium. Computer-readable medium includes data storage. By way of example, and not limitation, such computer-readable medium can comprise RAM, ROM, EEPROM, CD-ROM, Flash memory or other types of electric, magnetic, or optical storage medium, or any other medium that can be used to carry or store desired program code in the form of instructions or data structures and that can be accessed by a processor of a general purpose computer.

In various embodiments, the systems and methods described in the present disclosure can be addressed in terms of modules. The term "module" as used herein refers to a real-world device, component, or arrangement of components implemented using hardware, such as by an application specific integrated circuit (ASIC) or field-programmable gate array (FPGA), for example, or as a combination of hardware and software, such as by a microprocessor system and a set of instructions to implement the module's functionality, which (while being executed) transform the microprocessor system into a special-purpose device. A module can also be implemented as a combination of the two, with certain functions facilitated by hardware alone, and other functions facilitated by a combination of hardware and software. In certain implementations, at least a portion, and in some cases, all, of a module can be executed on the processor of a general purpose computer (such as the one described in greater detail in FIG. 3 above). Accordingly, each module can be realized in a variety of suitable configurations, and should not be limited to any particular implementation exemplified herein.

In the interest of clarity, not all of the routine features of the embodiments are disclosed herein. It would be appreciated that in the development of any actual implementation of the present disclosure, numerous implementation-specific decisions must be made in order to achieve the developer's specific goals, and these specific goals will vary for different implementations and different developers. It is understood that such a development effort might be complex and time-consuming, but would nevertheless be a routine undertaking of engineering for those of ordinary skill in the art, having the benefit of this disclosure.

Furthermore, it is to be understood that the phraseology or terminology used herein is for the purpose of description and not of restriction, such that the terminology or phraseology of the present specification is to be interpreted by the skilled in the art in light of the teachings and guidance presented herein, in combination with the knowledge of the skilled in the relevant art(s). Moreover, it is not intended for any term in the specification or claims to be ascribed an uncommon or special meaning unless explicitly set forth as such.

The various embodiments disclosed herein encompass present and future known equivalents to the embodiments disclosed herein by way of illustration. Moreover, while embodiments and applications have been shown and described, it would be apparent to those skilled in the art having the benefit of this disclosure that many more modifications than mentioned above are possible without departing from the concepts disclosed herein.

The invention claimed is:

1. A dual-mode radio frequency transceiver architecture, comprising a radio frequency front-end module, a receiving module, a sending module, and a dual-mode baseband processing section, wherein
the dual-mode baseband processing section is configured to determine hardware parameters of the receiving module or sending module based on a first mode or a second mode;
the radio frequency front-end module is configured to receive or send a first mode signal or a second mode signal;
the receiving module is configured to convert the first mode signal received by the radio frequency front-end module into a first mode baseband digital signal, or convert the second mode signal received by the radio frequency front-end module into a second mode baseband digital signal, and output the first mode baseband digital signal or the second mode baseband digital signal to the dual-mode baseband processing section;
the sending module is configured to convert the first mode baseband digital signal outputted by the dual-mode baseband processing section into the first mode signal, or convert the second mode baseband digital signal outputted by the dual-mode baseband processing section into the second mode signal, and output the first mode signal or the second mode signal to the radio frequency front-end module;
wherein the first mode is a first communication mode, and the second mode is a second communication mode, and
wherein the dual-mode baseband processing section comprises a unified hardware calling interface configured to determine hardware parameters of the sending module and the receiving module based on the signal rate and anti-interference requirement of the first mode or second mode.

2. The dual-mode radio frequency transceiver architecture according to claim 1, wherein the receiving module comprises a low noise amplifier, a mixer, a receiving-end phase locked loop, a complex filter, a limiter, and an analog-to-digital converter, and wherein
the low noise amplifier is configured to amplify the first mode signal or second mode signal received by the radio frequency front-end module;
the mixer is configured to remove a carrier frequency of the amplified first mode signal or the amplified second mode signal based on a local oscillator frequency outputted by the receiving-end phase locked loop;
the complex filter is configured to filter the carrier-removed first mode signal or second mode signal based on the first mode or second mode, and output the filtered first mode signal or the filtered second mode signal to the limiter, wherein the complex filter is a programmable filter;
the limiter is configured to conduct amplitude limiting on the filtered first mode signal or the filtered second mode signal;
the analog-to-digital converter is configured to convert the limited first mode signal into a first mode baseband digital signal, or convert the limited second mode signal into a second mode baseband digital signal, and output the first mode baseband digital signal or the second mode baseband digital signal to the dual-mode baseband processing section.

3. The dual-mode radio frequency transceiver architecture according to claim 1, wherein the sending module comprises a digital-to-analog converter, a shaping filter, a sending-end phase locked loop and a power amplifier, and wherein
the digital-to-analog converter is configured to conduct digital-to-analog conversion on the first mode baseband digital signal or second mode baseband digital signal outputted by the dual-mode baseband processing section based on the first mode or second mode;
the dual-mode baseband processing section turns on the shaping filter based on the first mode, the shaping filter being configured to shape-filter the converted first mode baseband digital signal and send out the shape-filtered first mode baseband digital signal, the sending-end phase locked loop being configured to output a carrier frequency corresponding to the first mode, the power amplifier being configured to amplify the first mode baseband digital signal bearing the carrier frequency and output the amplified first mode baseband digital signal to the radio frequency front-end module;

the dual-mode baseband processing section turns off the shaping filter based on the second mode, the sending-end phase locked loop being configured to output a carrier frequency corresponding to the second mode, the power amplifier being configured to amplify the received signal bearing the carrier frequency outputted by the sending-end phase locked loop, and output the amplified signal to the radio frequency front-end module.

4. The dual-mode radio frequency transceiver architecture according to claim 1, wherein the dual-mode baseband processing section controls the digital-to-analog converter to operate at a multi-bit mode based on the first mode, or control the digital-to-analog converter to operate at a single bit mode based on the second mode.

5. The dual-mode radio frequency transceiver architecture according to claim 1, wherein the dual-mode baseband processing section further comprises a dual-mode protocol stack scheduling module, a first mode protocol stack and a second mode protocol stack, and wherein the dual-mode protocol stack scheduling module is configured to uniformly schedule transmission events of the first mode protocol stack and the second mode protocol stack, and the dual-mode protocol stack scheduling module is configured to call the unified hardware calling interface at preset interval to set up a transmission channel of the first communication mode, and at each connection interval of the first communication mode, set up a transmission channel of the second communication mode.

6. The dual-mode radio frequency transceiver architecture according to claim 1, wherein the dual-mode baseband processing section comprises a digital signal conversion module and a modulation module, and wherein the dual-mode baseband processing section calls the digital signal conversion module based on the second mode to convert an offset-Quadrature Phase Shift Keying (O-QPSK) signal into a second mode equivalence bit stream; and the modulation module is configured to modulate the second mode equivalence bit stream or a first mode bit stream in a Frequency Shift Keying (FSK) approach to obtain a second mode baseband digital signal or a first mode baseband digital signal.

7. The dual-mode radio frequency transceiver architecture according to claim 6, wherein the dual-mode baseband processing section further comprises a digital signal reverse-conversion module and a demodulation module, and wherein the demodulation module is configured to demodulate the first mode baseband digital signal or second mode baseband digital signal; and the digital signal reverse-conversion module is configured to convert the second mode baseband digital signal demodulated by the demodulation module into an equivalent offset-Quadrature Phase Shift Keying (O-QPSK) signal and send out the O-QPSK signal.

\* \* \* \* \*